(12) United States Patent
Tseng

(10) Patent No.: US 8,054,107 B2
(45) Date of Patent: Nov. 8, 2011

(54) OPERATIONAL CIRCUIT HAVING PROTECTION CIRCUIT FOR DETECTING DRIVING CURRENT TO ADJUST CONTROL SIGNAL AND RELATED CONTROL METHOD

(75) Inventor: Wei-Kai Tseng, Tainan County (TW)

(73) Assignee: Himax Technologies Limited, Dist, Tainan (TW)

( * ) Notice: Subject to any disclaimer, the term of this patent is extended or adjusted under 35 U.S.C. 154(b) by 0 days.

(21) Appl. No.: 12/650,481

(22) Filed: Dec. 30, 2009

(65) Prior Publication Data

US 2011/0156761 A1 Jun. 30, 2011

(51) Int. Cl.
*H03K 3/00* (2006.01)
(52) U.S. Cl. .......................... 327/108; 327/112; 330/265
(58) Field of Classification Search .................. 327/108, 327/112; 330/265
See application file for complete search history.

(56) References Cited

U.S. PATENT DOCUMENTS

| 4,859,870 | A | * | 8/1989 | Wong et al. | 327/108 |
| 5,049,834 | A | * | 9/1991 | Kasai | 330/255 |
| 5,467,058 | A | * | 11/1995 | Fujita | 330/267 |
| 5,585,763 | A | * | 12/1996 | Navabi et al. | 330/255 |
| 6,768,367 | B1 | * | 7/2004 | Meadows et al. | 327/333 |
| 7,242,250 | B2 | * | 7/2007 | Tsurumi | 330/265 |
| 7,724,089 | B2 | * | 5/2010 | Miyamoto et al. | 330/255 |

* cited by examiner

*Primary Examiner* — Kenneth B. Wells
(74) *Attorney, Agent, or Firm* — Winston Hsu; Scott Margo

(57) ABSTRACT

An operational circuit includes: a first stage having a first input terminal for receiving an input signal and a second input terminal for receiving an output signal of the operational circuit, for outputting a first control signal at a first output terminal and a second control signal at a second output terminal according to the input signal and the output signal; a second stage coupled to the first stage, for generating the output signal according to a first driving current controlled by the first control signal and a second driving current controlled by the second control signal; and a protection circuit coupled between the first stage and the second stage, for detecting the first driving current to selectively adjust the first control signal.

10 Claims, 4 Drawing Sheets

US 8,054,107 B2

OPERATIONAL CIRCUIT HAVING PROTECTION CIRCUIT FOR DETECTING DRIVING CURRENT TO ADJUST CONTROL SIGNAL AND RELATED CONTROL METHOD

BACKGROUND OF THE INVENTION

1. Field of the Invention

The present invention relates to a current driving circuit and related control method, and more particularly to a current driving circuit having a small and stable leakage current, and a control method thereof.

2. Description of the Prior Art

A current driving circuit is utilized to generate a large current according to an input voltage. To sustain the large current, an output stage of the current driving circuit is designed to have a large size. In other words, the driving transistors of the output stage possess a large aspect ratio (Width/Length, W/L). Since the driving capability of the output stage transistors is strong, a malfunction current may be induced, which may seriously affect the normal operation of the whole system connected to the current driving circuit. For example, when the output terminal of the current driving circuit is misconnected to the ground voltage or the supply voltage, a large error-current may be induced to flow through the driving transistor between the ground voltage and the output terminal, or through the driving transistor between the supply voltage and the output terminal. This large error-current will damage the path between the driving transistor and the ground voltage, or the path between the driving transistor and the supply voltage. Moreover, the large error-current may shift the voltage level of the ground voltage or the supply voltage by an offset voltage such that the other functional circuits coupled to the ground voltage or the supply voltage will be affected, thereby generating malfunctions. Providing an efficient and stable current detecting method for a current driving circuit is therefore a significant concern in the field of current drivers.

SUMMARY OF THE INVENTION

One of the objectives of the present invention is to provide a current driving circuit having a small and stable leakage current, and a control method thereof.

According to a first embodiment of the present invention, an operational circuit is disclosed. The operational circuit comprises a first stage, a second stage, and a protection circuit. The first stage has a first input terminal for receiving an input signal and a second input terminal for receiving an output signal of the operational circuit, for outputting a first control signal at a first output terminal and a second control signal at a second output terminal according to the input signal and the output signal. The second stage is coupled to the first stage for generating the output signal according to a first driving current controlled by the first control signal and a second driving current controlled by the second control signal. The protection circuit is coupled between the first stage and the second stage for detecting the first driving current to selectively adjust the first control signal.

According to a second embodiment of the present invention, a control method for an operational circuit is disclosed. The operational circuit comprises: a first stage having a first input terminal for receiving an input signal and a second input terminal for receiving an output signal of the operational circuit, for outputting a first control signal at a first output terminal and a second control signal at a second output terminal according to the input signal and the output signal; and a second stage for generating the output signal according to a first driving current controlled by the first control signal and a second driving current controlled by the second control signal. The control method comprises the step of: detecting the first driving current, and selectively adjusting the first control signal according to the first driving current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
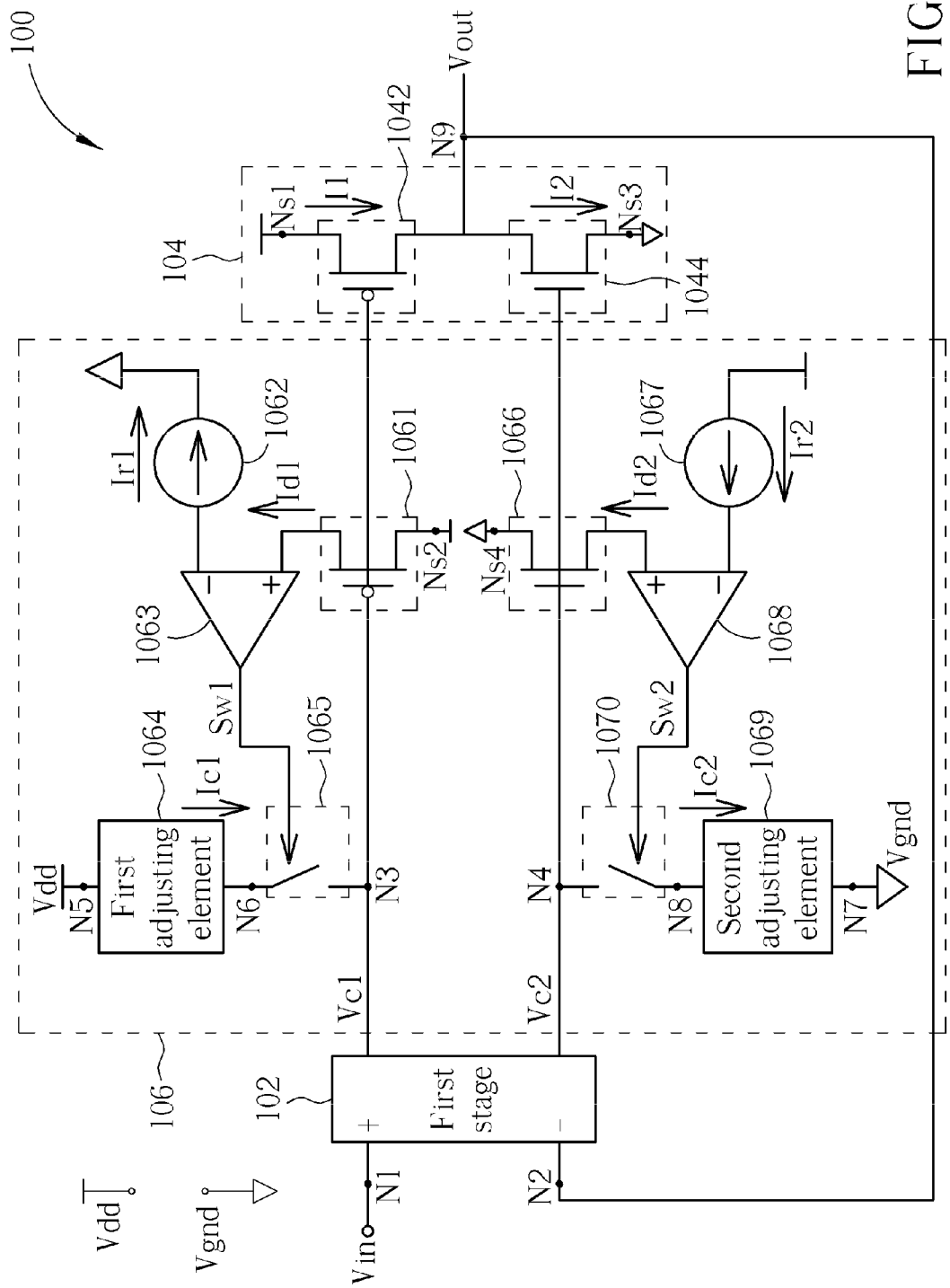
FIG. 1 is a diagram illustrating an operational circuit according to an embodiment of the present invention.

Please refer to FIG. 1. FIG. 1 is a diagram illustrating an operational circuit 100 according to an embodiment of the present invention. The operational circuit 100 comprises a first stage 102, a second stage 104, and a protection circuit 106. The first stage 102 has a first input terminal N1 for receiving an input signal Vin and a second input terminal N2 for receiving an output signal Vout of the operational circuit 100, wherein the first stage 102 generates a first control signal Vc1 and a second control signal Vc2 according to the input signal Vin and the output signal Vout. The second stage 104 is coupled to the first stage 102 for generating the output signal Vout according to a first driving current I1 controlled by the first control signal Vc1 and a second driving current I2 controlled by the second control signal Vc2. The protection circuit 106 is coupled to the first stage 102 and the second stage 104 for generating a first detecting current Id1 with respect to the first driving current I1, and comparing the first detecting current Id1 with a first reference current Ir1 to selectively adjust the first control signal Vc1. More specifically, the protection circuit 106 is coupled to the two common nodes (i.e., N3, N4) of the outputs of the first stage 102 and the inputs of the second stage 104 respectively. In this embodiment, the protection circuit 106 further generates a second detecting current Id2 with respect to the second driving current I2, and compares the second detecting current Id2 with a second reference current Ir2 to selectively adjust the second control signal Vc2. Please note that the protection circuit 106 is not limited to adjust both the first control signal Vc1 and the second control signal Vc2. In one embodiment of the present invention, the protection circuit 106 only adjusts the first control signal Vc1, and in another embodiment of the present invention, the protection circuit 106 only adjusts the second control signal Vc2.

In addition, the second stage 104 comprises a first driving element 1042 and a second driving element 1044, wherein the first driving element 1042 is a P-type field effect transistor and the second driving element 1044 is an N-type field effect transistor. The first driving element 1042 is coupled to a first output terminal N3 of the first stage 102 for receiving the first control signal Vc1 to generate the first driving current I1. The second driving element 1044 is coupled to a second output terminal N4 of the first stage 102 for receiving the second control signal Vc2 to generate the second driving current I2. The protection circuit 106 comprises a first detecting element 1061, a first reference current generator 1062, a first current comparator 1063, a first adjusting element 1064, a first switch element 1065, a second detecting element 1066, a second reference current generator 1067, a second current comparator 1068, a second adjusting element 1069, and a second switch element 1070. The first detecting element 1061 is coupled to the first output terminal N3 for detecting the first driving current I1 to generate the first detecting current Id1. The first reference current generator 1062 generates the first reference current Ir1. The first current comparator 1063 is coupled to the first detecting element 1061 and the first reference current generator 1062 for comparing the first detecting current Id1 and the first reference current Ir1 to generate a first switching signal Sw1. The first adjusting element 1064 has a first terminal N5 coupled to a first supply voltage Vdd (i.e. a power supply). The first switch element 1065 has a first terminal N6 coupled to a second terminal of the first adjusting element 1064, and a second terminal selectively coupled to the first output terminal N3 of the first stage 102 according to the first switching signal Sw1, wherein the first adjusting element 1064 is operative to adjust the first control signal Vc1 when the first switch element 1065 is switched on.

Furthermore, the second detecting element 1066 is coupled to the second output terminal N4 for detecting the second driving current I2 to generate the second detecting current Id2. The second reference current generator 1067 generates the second reference current Ir2. The second current comparator 1068 is coupled to the second detecting element 1066 and the second reference current generator 1067 for comparing the second detecting current Id2 and the second reference current Ir2 to generate a second switching signal Sw2. The second adjusting element 1069 has a first terminal N7 coupled to a second supply voltage Vgnd (i.e. the ground voltage). The second switch element 1070 has a first terminal N8 coupled to a second terminal of the second adjusting element 1069, and a second terminal selectively coupled to the second output terminal N4 of the first stage 102 according to the second switching signal Sw2, wherein the second adjusting element 1069 is operative to adjust the second control signal Vc2 when the second switch element 1070 is switched on. In this embodiment, the first detecting element 1061 is a P-type field effect transistor and the second detecting element 1066 is an N-type field effect transistor. More specifically, the first detecting element 1061 is configured to mirror the first driving current I1 to generate the first detecting current Id1, and the second detecting element 1066 is configured to mirror the second driving current I2 to generate the second detecting current Id2 as shown in FIG. 1. Since the first driving element 1042 is implemented by a P-type field effect transistor, the first detecting element 1061 is implemented by another P-type field effect transistor to mirror the first driving current I1 to generate the first detecting current Id1. Similarly, since the second driving element 1044 is implemented by an N-type field effect transistor, the second detecting element 1066 is implemented by another N-type field effect transistor to mirror the second driving current I2 to generate the second detecting current Id2.

Please refer to FIG. 1, the source terminals of the P-type field effect transistors of first driving element 1042 and the first detecting element 1061 are labeled as Ns1 and Ns2 respectively, and the source terminals of the N-type field effect transistors of second driving element 1044 and the second detecting element 1066 are labeled as Ns3 and Ns4 respectively. Accordingly, the voltage drop between the source terminal Ns1 and the gate terminal (i.e., N3) of the P-type field effect transistor of first driving element 1042 equals to the voltage drop between the source terminal Ns2 and the gate terminal (i.e., N3) of the P-type field effect transistor of first detecting element 1061, and the voltage drop between the source terminal Ns3 and the gate terminal (i.e., N4) of the N-type field effect transistor of second driving element 1044 equals to the voltage drop between the source terminal Ns4 and the gate terminal (i.e., N4) of the N-type field effect transistor of second detecting element 1066. Therefore, the first detecting current Id1 is a mirrored current of the first driving current I1, and the second detecting current Id2 is a mirrored current of the second driving current I2. Furthermore, in this embodiment, the first adjusting element 1064 is a current generator for providing a first control current Ic1 when the first switch element 1065 is switched on, and the second adjusting element 1069 is a current generator for providing a second control current Ic2 when the second switch element 1070 is switched on, but this is not meant to be a limitation of the present invention. In another embodiment of the present invention, the first reference current generator 1062, the first adjusting element 1064, the second reference current generator 1067 and the second adjusting element 1069 can be implemented by four current mirrors respectively.

Figure 2:
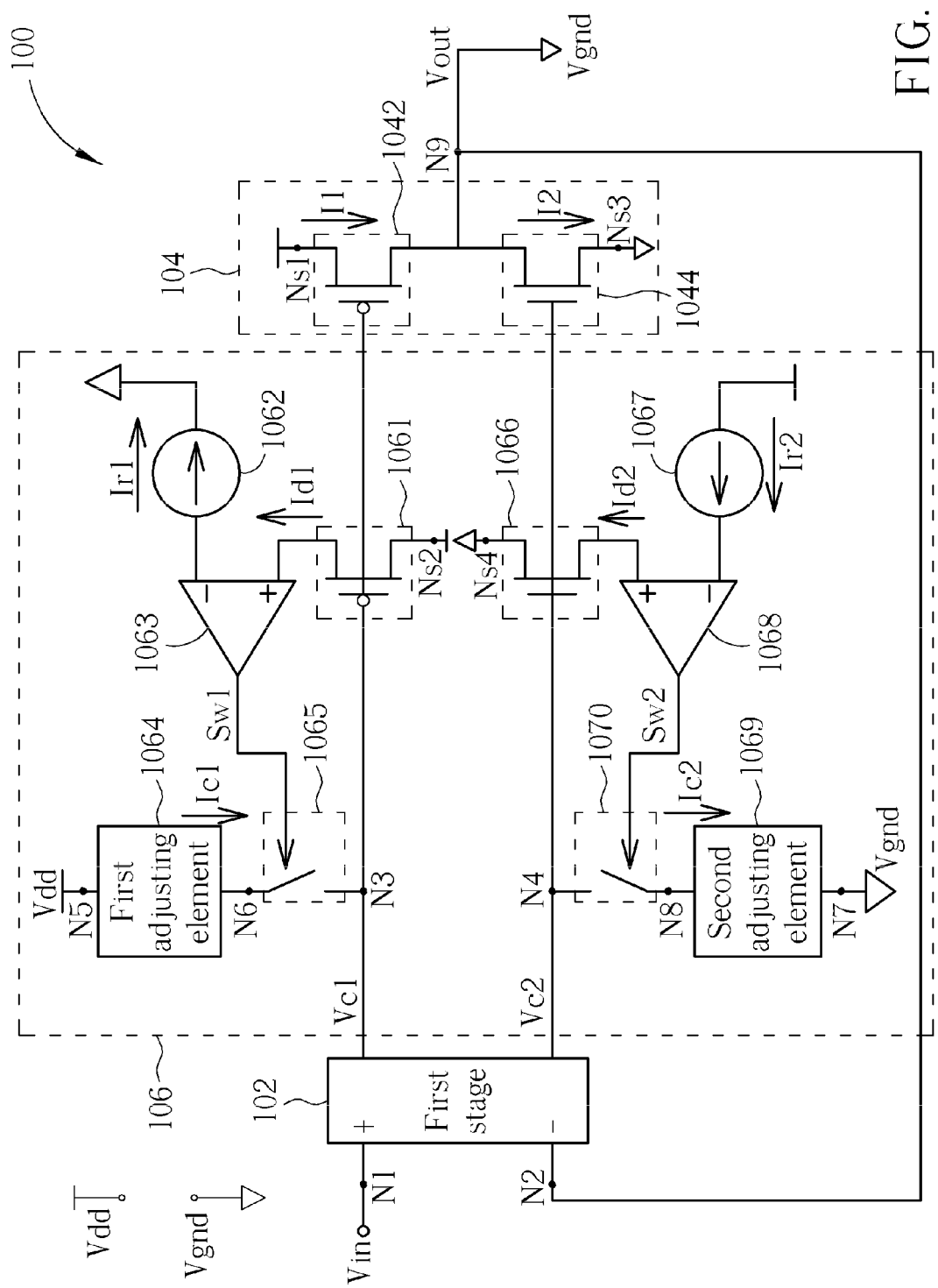
FIG. 2 is a diagram illustrating the case of misconnecting an output terminal of the operational circuit to a ground voltage.

When the operational circuit 100 is operative, the first driving current I1 is a sourcing current of the second stage 104, i.e., the first driving current I1 is operated to provide a current to the output terminal N9. The second driving current I2 is a sinking current of the second stage 104, i.e., the second driving current I2 is operated to sink a current from the output terminal N9. In addition, when the operational circuit 100 is under normal operation, the first switch element 1065 and the second switch element 1070 are open (i.e., switched off). In other words, when the operational circuit 100 is under normal operation, the first detecting current Id1 is smaller than the first reference current Ir1, and the second detecting current Id2 is smaller than the second reference current Ir2. However, when the output terminal N9 of the second stage 104 is misconnected to the ground voltage Vgnd, a large driving current I1 may be induced to flow from the supply voltage Vdd to the output terminal N9 (i.e., through the first driving element 1042) as shown in FIG. 2. FIG. 2 is a diagram illustrating the case of misconnecting the output terminal N9 of the operational circuit 100 to the ground voltage Vgnd. In this case, the first detecting current Id1 will be larger than the first reference current Ir1, and the first current comparator 1063 therefore switches the voltage level of the first switching signal Sw1 to the high voltage level from the low voltage level to close the first switch element 1065 (i.e., the first switch element 1065 is switched on). More specifically, since the voltage drop between the source terminal Ns1 and the gate terminal (i.e., N3) of the P-type field effect transistor of first driving element 1042 equals to the voltage drop between the source terminal Ns2 and the gate terminal (i.e., N3) of the P-type field effect transistor of first detecting element 1061, the first driving current I1 is mirrored to the first detecting element 1061 such that the first detecting current Id1 is also a large current when the first driving current I1 becomes a large current. The first control current Ic1 is then fed to the first output terminal N3 of the first stage 102 to increase the voltage level of the first control signal Vc1. Therefore, by reducing the dropout voltage between the gate terminal and the source terminal of the P-type field effect transistor (i.e., the first driving element 1042), the driving current I1 is reduced. Please note that, according to this embodiment, the first control current Ic1 is designed to adjust the first control signal Vc1 to reduce the first driving current I1 to a target current level which still makes the first detecting current Id1 greater than the first reference current Ir1. Then, the first switch element 1065 is kept switched on until the output terminal N9 of the second stage 104 is disconnected from the ground voltage Vgnd. In other words, the first driving current I1 is reduced to a small leakage current (i.e., the target current level) when the first switch element 1065 is switched on. Please note that, the present invention utilizing the first adjusting element 1064 to generate the first control current Ic1 to adjust the first driving current I1 into the small leakage current rather than directly connecting the first terminal N6 of the first switch element 1065 to the supply voltage Vdd has the advantage of preventing the operational circuit 100 from oscillating.

Figure 3:
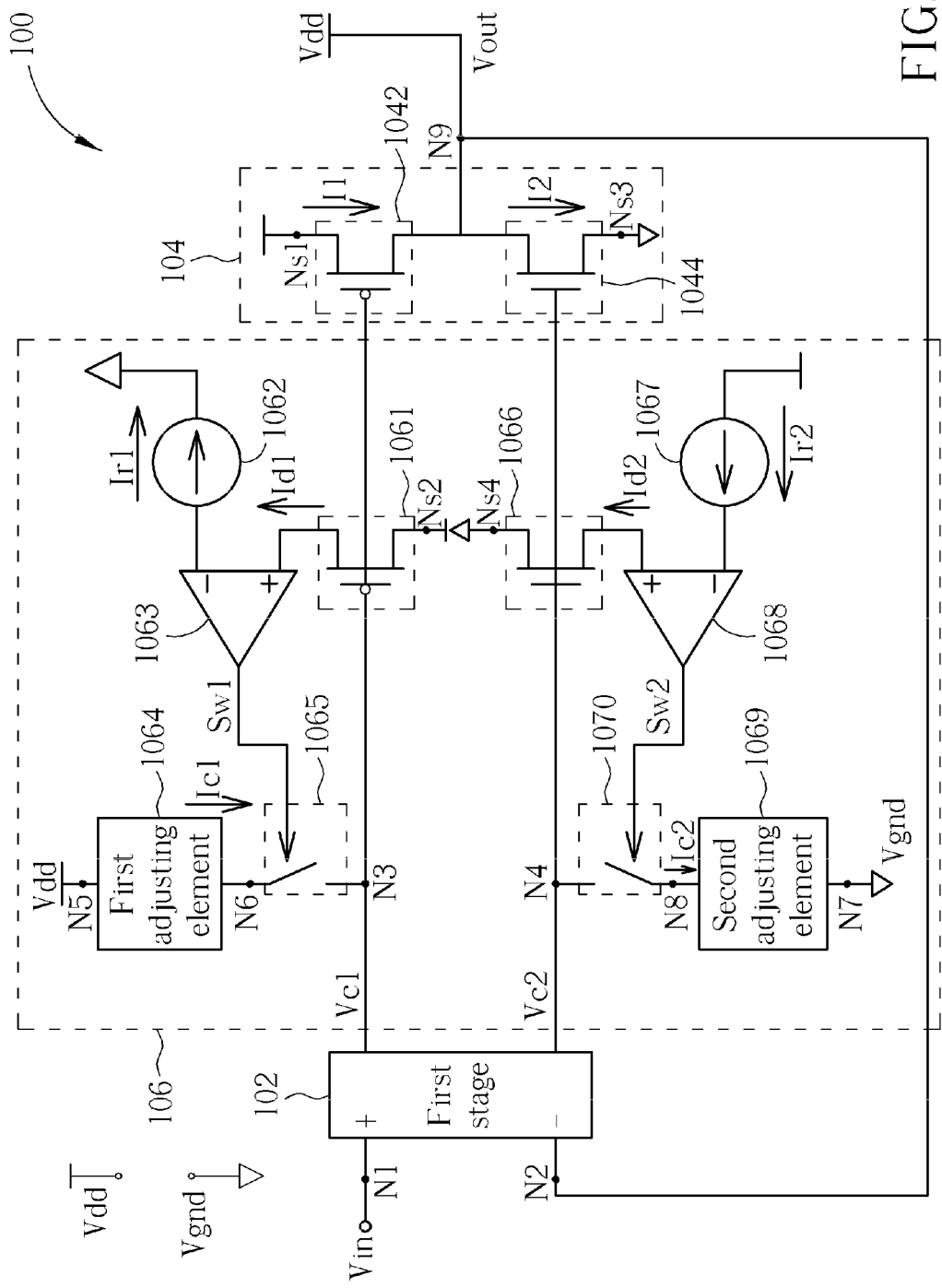
FIG. 3 is a diagram illustrating the case of misconnecting the output terminal of the operational circuit to a supply voltage.

When the output terminal N9 of the second stage 104 is misconnected to the supply voltage Vdd, a large driving current I2 may be induced to flow from the output terminal N9 to the ground voltage Vgnd (i.e., through the second driving element 1044) as shown in FIG. 3. FIG. 3 is a diagram illustrating the case of misconnecting the output terminal N9 of the operational circuit 100 to the supply voltage Vdd. In this situation, the second detecting current Id2 will be larger than the second reference current Ir2, and the second current comparator 1068 therefore switches the voltage level of the second switching signal Sw2 to the high voltage level from the low voltage level to close the second switch element 1070 (i.e., the second switch element 1070 is switched on). More specifically, since the voltage drop between the source terminal Ns3 and the gate terminal (i.e., N4) of the N-type field effect transistor of second driving element 1044 equals to the voltage drop between the source terminal Ns4 and the gate terminal (i.e., N4) of the N-type field effect transistor of second detecting element 1066, the second driving current I2 is mirrored to the second detecting element 1066 such that the second detecting current Id2 is also a large current when the second driving current I2 becomes a large current. The second control current Ic2 then discharges the second output terminal N4 of the first stage 102 to decrease the voltage level of the second control signal Vc2. Similarly, by reducing the dropout voltage between the gate terminal and the source terminal of the N-type field effect transistor (i.e., the second driving element 1044), the driving current I2 is reduced. Please note that, according to this embodiment, the second control current Ic2 is designed to adjust the second control signal Vc2 to reduce the second driving current I2 to a target current level which still makes the second detecting current Id2 greater than the second reference current Ir2. Then, the second switch element 1070 is kept switched on until the output terminal N9 of the second stage 104 is disconnected from the supply voltage Vdd. In other words, the second driving current I2 is reduced to a small leakage current (i.e., the target current level) when the second switch element 1070 is switched on. Please note that, the present invention utilizing the second adjusting element 1069 to generate the second control current Ic2 to adjust the second driving current I2 into the small leakage current rather than directly connecting the second terminal N8 of the second switch element 1070 to the ground voltage Vgnd has the advantage of preventing the operational circuit 100 from oscillating.

Please note that one of the features of the operational circuit 100 is not to directly connect the supply voltage Vdd to the first output terminal N3 of the first stage 102 when the first switch element 1065 is switched on, and not to directly connect the ground voltage Vgnd to the second output terminal N4 of the first stage 102 when the second switch element 1070 is switched on. Therefore, the first adjusting element 1064 is not limited to a current generator; any other device that couples between the supply voltage Vdd and the first terminal N6 and is capable of adjusting the first control signal Vc1 to reduce the first driving current I1 to the target current level while still making the first detecting current Id1 greater than the first reference current Ir1 also belongs to the scope of the present invention. Similarly, the second adjusting element 1069 is also not limited to a current generator; any other device that couples between the ground voltage Vgnd and the first terminal N8 and is capable of adjusting the second control signal Vc2 to reduce the second driving current I2 to the target current level while still making the second detecting current Id2 greater than the second reference current Ir2 also belongs to the scope of the present invention. Furthermore, the operational circuit 100 is not limited to adjust both the first control signal Vc1 and the second control signal Vc2. In one embodiment, only portions of the protection circuit 106 (i.e., the first detecting element 1061, the first reference current generator 1062, the first current comparator 1063, the first adjusting element 1064, and the first switch element 1065) are employed in the operational circuit 100, and in another embodiment, the other portions of the protection circuit 106 (i.e., the second detecting element 1066, the second reference current generator 1067, the second current comparator 1068, the second adjusting element 1069, and the second switch element 1070) are employed in the operational circuit 100. Both these embodiments also possess the above-mentioned advantages of the present invention.

In addition, the present invention is not limited to comparing the first detecting current Id1 with the first reference current Ir1 to generate the first switching signal Sw1. Any other device capable of generating the first switching signal Sw1 according to the first driving current I1 also belongs to the scope of the present invention. Similarly, the present invention is not limited to comparing the second detecting current Id2 with the second reference current Ir2 to generate the second switching signal Sw2. Any other device capable of generating the second switching signal Sw2 according to the second driving current I2 also belongs to the scope of the present invention.

Figure 4:
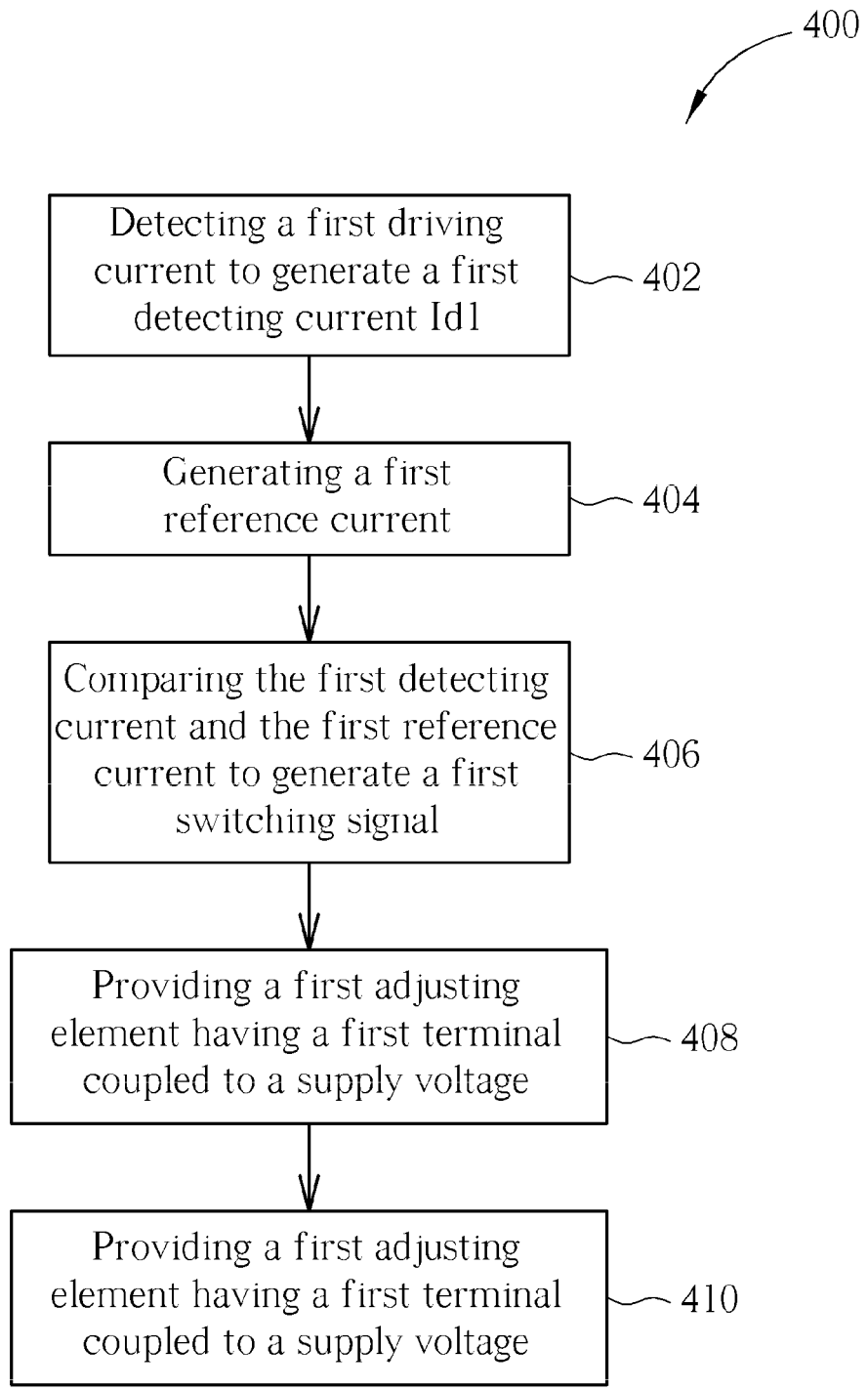
FIG. 4 is a flowchart illustrating a control method for the operational circuit according to an embodiment of the present invention.

Please refer to FIG. 4. FIG. 4 is a flowchart illustrating a control method 400 for an operational circuit according to an embodiment of the present invention. For brevity, the control method 400 is illustrated in conjunction with the operational circuit 100 shown in FIG. 1, but this is not meant to be a limitation of the present invention. Provided that substantially the same result is achieved, the steps of the flowchart shown in FIG. 4 need not be in the exact order shown and need not be contiguous; that is, other steps can be intermediate. The control method 400 comprises the following steps:

Step 402: Detect the first driving current I1 to generate the first detecting current Id1;

Step 404: Generate the first reference current Ir1;

Step 406: Compare the first detecting current Id1 and the first reference current Ir1 to generate the first switching signal Sw1;

Step 408: Provide the first adjusting element 1064 having the first terminal N5 coupled to the supply voltage Vdd;

Step 410: Selectively couple the second terminal N6 of the first adjusting element 1064 to the first output terminal N3 of the first stage 102 according to the first switching signal Sw1.

Please note that the control method 400 only illustrates the operation of portions of the protection circuit 106 (i.e., the first detecting element 1061, the first reference current generator 1062, the first current comparator 1063, the first adjusting element 1064, and the first switch element 1065) in the operational circuit 100, however those skilled in this art will readily understand that the control method 400 may also be applicable to the operation of the other portions of the protection circuit 106 (i.e., the second detecting element 1066, the second reference current generator 1067, the second current comparator 1068, the second adjusting element 1069, and the second switch element 1070), and therefore a detailed description is omitted here for brevity. In step 402, when the output terminal N9 of the second stage 104 is misconnected to the ground voltage Vgnd, the first detecting element 1061 detects the first driving current I1 to generate the first detecting current Id1. The first current comparator 1063 then compares the first detecting current Id1 and the first reference current Ir1 to generate the first switching signal Sw1 (step 406). When the first detecting current Id1 is larger than the first reference current Ir1, the first switching signal Sw1 switches on the first switch element 1065 to couple the second terminal N6 of the first adjusting element 1064 to the first output terminal N3 of the first stage 102 (step 410). The first control current Ic1 is then fed to the first output terminal N3 of the first stage 102 to increase the voltage level of the first control signal Vc1. Accordingly, the dropout voltage between the gate terminal and the source terminal of the P-type field effect transistor (i.e., the first driving element 1042) is reduced. Therefore, by reducing the dropout voltage between the gate terminal and the source terminal of the P-type field effect transistor, the driving current I1 is reduced. Please note that, according to this embodiment, the first control current Ic1 is designed to adjust the first control signal Vc1 to reduce the first driving current I1 to the target current level which still makes the first detecting current Id1 greater than the first reference current Ir1. Then, the first switch element 1065 is kept switched on until the output terminal N9 of the second stage 104 is disconnected from the ground voltage Vgnd. In other words, the first driving current I1 is reduced to a small leakage current (i.e., the target current level) when the first switch element 1065 is switched on. Please note that, the present invention utilizing the first adjusting element 1064 to generate the first control current Ic1 to adjust the first driving current I1 into the small leakage current rather than directly connecting the first terminal N6 of the first switch element 1065 to the supply voltage Vdd has the advantage of preventing the operational circuit 100 from oscillating.

Briefly, the above-mentioned embodiments reduce the leakage current to an acceptable value but do not turn off the driving transistors in the second stage 104 in order to keep the operational circuit 100 stable when the output terminal N9 of the operational circuit 100 is misconnected to the supply voltage Vdd or ground voltage Vgnd.

Those skilled in the art will readily observe that numerous modifications and alterations of the device and method may be made while retaining the teachings of the invention.

What is claimed is:

1. An operational circuit, comprising:
   a first stage, having a first input terminal for receiving an input signal and a second input terminal for receiving an output signal of the operational circuit, for outputting a first control signal at a first output terminal and a second control signal at a second output terminal according to the input signal and the output signal;
   a second stage, coupled to the first stage, for generating the output signal according to a first driving current controlled by the first control signal and a second driving current controlled by the second control signal; and
   a protection circuit, coupled between the first stage and the second stage, for detecting the first driving current to selectively adjust the first control signal, wherein the protection circuit comprises:
      a first switch control element, for detecting the first driving current to generate a first switching signal;
      a first adjusting element, having a first terminal coupled to a first supply voltage; and
      a first switch element, having a first terminal coupled to a second terminal of the first adjusting element, and a second terminal selectively coupled to the first output terminal of the first stage according to the first switching signal, wherein the first adjusting element is operative to adjust the first control signal when the first switch element is switched on.

2. The operational circuit of claim 1, wherein the first driving current is a sourcing current of the second stage.

3. The operational circuit of claim 1, wherein the first driving current is a sinking current of the second stage.

4. The operational circuit of claim 1, wherein the protection circuit generates a first detecting current with respect to the first driving current, and compares the first detecting current with a first reference current to selectively adjust the first control signal.

5. The operational circuit of claim 4, wherein when the first detecting current is greater than the first reference current, the protection circuit adjusts the first control signal to thereby reduce the first driving current.

6. The operational circuit of claim 5, wherein the protection circuit adjusts the first control signal to reduce the first driving current to a target current level which still makes the first detecting current greater than the first reference current.

7. The operational circuit of claim 4, wherein the protection circuit further generates a second detecting current with respect to the second driving current, and compares the second detecting current with a second reference current to selectively adjust the second control signal.

8. The operational circuit of claim 1, wherein the second stage comprises:
   a first driving element, coupled to the first output terminal of the first stage, for receiving the first control signal to generate the first driving current; and
   a second driving element, coupled to the second output terminal of the first stage, for receiving the second control signal to generate the second driving current; and
   the first switch control element comprises:
   a first detecting element, coupled to the first output terminal, for detecting the first driving current to generate a first detecting current;
   a first reference current generator, for generating a first reference current; and a first current comparator, coupled to the first detecting element and the first reference current generator, for comparing the first detecting current and the first reference current to generate the first switching signal.

9. The operational circuit of claim 1, wherein the first adjusting element is a current generator for providing a control current when the first switch element is switched on.

10. The operational circuit of claim 1, wherein the protection circuit further comprises:
a second switch control element, for detecting the second driving current to generate a second switching signal;
a second adjusting element, having a first terminal coupled to a second supply voltage; and
a second switch element, having a first terminal coupled to a second terminal of the second adjusting element, and a second terminal selectively coupled to the second output terminal of the first stage according to the second switching signal, wherein the second adjusting element is operative to adjust the second control signal when the second switch element is switched on.

* * * * *